United States Patent [19]
Ito et al.

[11] Patent Number: 5,079,745
[45] Date of Patent: Jan. 7, 1992

[54] SENSE AMPLIFIER CAPABLE OF HIGH SPEED OPERATION

[75] Inventors: Junko Ito; Takayuki Miyamoto, both of Hyogo, Japan

[73] Assignee: Mitsubishi Denki Kabushiki Kaisha, Tokyo, Japan

[21] Appl. No.: 228,586

[22] Filed: Aug. 5, 1988

[30] Foreign Application Priority Data

Aug. 6, 1987 [JP] Japan .................. 62-196969

[51] Int. Cl.$^5$ .................. G11C 7/00; G11C 11/409
[52] U.S. Cl. .................. 365/207; 365/189.07; 365/189.09; 365/210
[58] Field of Search .................. 365/189.07, 189.09, 365/205, 208, 207, 210

[56] References Cited

U.S. PATENT DOCUMENTS

| | | |
|---|---|---|
| 3,940,747 | 2/1976 | Kuo et al. |
| 4,053,873 | 10/1977 | Freeman |
| 4,291,392 | 9/1981 | Proebsting |
| 4,586,171 | 4/1986 | Fujishima .................. 365/207 |
| 4,604,732 | 8/1986 | van Tran .................. 365/207 |
| 4,730,280 | 3/1988 | Aoyama .................. 365/205 |

OTHER PUBLICATIONS

IEEE Journal of Solid State Circuits, vol. SC-16, No. 5, Oct. 1981, pp. 479-487.
IBM Technical Disclosure Bulletin, vol. 27, No. 4B, Sep. 1984, pp. 2632-2635.

*Primary Examiner*—Alyssa H. Bowler
*Attorney, Agent, or Firm*—Lowe, Price, Leblanc & Becker

[57] ABSTRACT

A voltage amplifier comprises a pair of bit lines (B1, B2) connected to a dummy cell and a plurality of memory cells; a pair of n channel MOS transistors (Q1, Q2) connected between the pair of bit lines and an I/O line each operating in response to the potential of the other bit line; and a pair of p channel MOS transistors (Q5, Q6) connected between the pair of n channel MOS transistors (Q1, Q2) and the bit lines (B1, B2) operating in response to the ground potential. As the voltage difference of the pair of bit lines is amplified, the p channel MOS transistor connected to the bit line held at the lower potential turns on, and the connection between the bit line and the n channel MOS transistor is cut off.

6 Claims, 4 Drawing Sheets

SENSE AMPLIFIER CAPABLE OF HIGH SPEED OPERATION

BACKGROUND OF THE INVENTION

1. Field of the Invention

The present invention relates to a sense amplifier of a semiconductor memory device and, more specifically, to a sense amplifier capable of high speed operation.

2. Description of the Prior Art

The present invention is applicable to a MOS type semiconductor memory comprising a MOS transistor, and particularly to a MOS dynamic RAM (Random Access Memory).

A description is given hereinafter as to the MOS dynamic RAM which is a background of the present invention.

FIG. 1 is a block diagram showing an example of a specified circuit of a conventional 1 M bit dynamic RAM having 1048576 memory cells. Referring to FIG. 1, a summary of the basic operation of the dynamic RAM will be hereinafter described.

A clock generator 10 receives an RAS (Row Address Strobe) signal, and a CAS (Column Address Strobe) signal from a CPU (Central Processing Unit) and generates clock signals $\phi_1$ and $\phi_2$. In the normal read/write operation of the dynamic RAM, an address buffer 21 receives external address inputs $A_0$ to $A_9$ on a time share basis and applies internal address signals $A_0$ to $A_9$ on a time share basis to a row decoder 22 and a column decoder 23. The row decoder 22 and the column decoder 23 decode the internal address signals $A_0$ to $A_9$ and apply the decoded signals to a memory cell array 25 and an I/O control 24. The writing operation of the input data and the reading operation of the output data are carried out for a memory cell having the address designated as described above. The data in buffers 26 receives the input data and transfers the input data to the memory cell array 25 via the I/O control 24 and the sense amplifiers in response to a clock signal. On the other hand, the data out buffers 27 receive the data from the memory cell array 25 via the sense amplifiers and the I/O control 24 and outputs the output data in response to the clock signal.

FIG. 2 is a block diagram showing a major portion of a conventional dynamic RAM.

Referring to FIG. 2, the major portion of the dynamic RAM comprises an array comprising a plurality of memory cells serving as memory portion, row decoder and a column decoder for selecting an address of each memory cell, and a peripheral circuit portion comprising a sense amplifier connected to data in/out buffers. The plurality of memory cells serving as memory portions are connected to intersection points of word lines connected to the row decoder and bit lines connected to the column decoder, these word and bit lines constituting a matrix. The above-mentioned array is thus implemented.

Next, an operation of the dynamic RAM is described. When a word line and a bit line are selected by the row decoder and the column decoder in response to a row address signal and a column address signal externally provided, a memory cell at the intersection point of the word line and the bit line is selected, and information is read from or written in the memory cell through the sense amplifier. As to the detail explanation of dynamic RAM, U.S. Pat. No. 3,940,747, entitled "High Density, High Speed Random Access Read-Write Memory" can be referred to.

The basic operation of the sense amplifier will be described. Referring to FIG. 2, a pair of two bit lines each comprising a plurality of memory cells and a dummy cell is coupled to a sense amplifier. The dummy cell is a cell having the same structure as the memory cell but smaller capacitance of the capacitor. The memory cell determines the presence/absence of signal charges dependent on whether charges are held or not in the capacitor constituting the memory cell. The potential of the bit line to which the memory cell is connected changes dependent on whether charges are held or not in the memory cell capacitor. The sense amplifier detects the potential of the bit line connected to the memory cell from one of the two bit lines connected thereto, and detects the potential of the bit line connected to the dummy cell from the other one of bit lines. The small potential difference between the two bit lines is amplified by the sense amplifier, whereby the presence/absence of the charges representing information in the memory cell is determined.

The sense amplifier determines the presence/absence of the charges representing information in the following manner. FIG. 3 shows one sense amplifier and two bit lines connected thereto. Referring to FIG. 3, first the two bit lines B1 and B2 are charged to the same potential $V_P$ in advance to be in the floating state. A certain word line $W_N$ is selected and the memory cell $Q_{NX}$ and a bit line B2 are rendered conductive. Let us assume that charges representing information are held in the memory cell $Q_{NX}$ ("H" is assigned to this state, while "L" is assigned to the opposite state). The potential of the bit line B2 changes by $\Delta V_H$. Before reading, the dummy cell is brought to the "L" state. The reason for this is that the potential of the bit line B1 from the dummy cell is used as the reference signal. Namely, in reading, the word line $R_X$ to which the dummy cell is connected is also selected. The potential of the bit line B1 to which the dummy, cell is connected changes by $\Delta V_D$. The potential difference between the two bit lines is compared in the sense amplifier, whereby it is determined whether the data held in the memory cell is "H" or "L".

The potential difference from the $V_P$ appearing on the respective bit lines B1 and B2 of the sense amplifier would be represented by the following equation.

$$\Delta V_H = \frac{C_S}{C_S + C_B} (V_H - V_P) \quad (1)$$

where $\Delta V_H$: increased voltage value of the bit line potential
$C_S$: capacitor capacitance of the memory cell
$C_B$: capacitor capacitance of the bit line $$\Delta V_L = \frac{C_S}{C_S + C_B} (V_L - V_P) \quad (2)$$

where $\Delta V_L$: decreased voltage value of the bit line potential $$\Delta V_D = \frac{C_S}{C_D + C_B} (V_L - V_P) \quad (3)$$

where $\Delta V_D$: the amount of change of the voltage in the dummy cell $C_D$: capacitance value of the dummy cell The sense amplifier determines the presence/absence of the charges representing information in the memory cell in the above described manner. In order to attain the above described function, the sense amplifier should have the following functions.

(1) capability of sensing small change of voltage
(2) fast operation speed
(3) wide range of operation power supply voltage
(4) small area of occupation FIG. 4 shows a basic circuit of the sense amplifier. The basic circuit of the sense amplifier will be described with reference to FIG. 4.

The basic circuit of the sense amplifier comprises: n channel MOS transistors Q1 and Q2 connected to the bit lines B1 and B2 for structuring the amplifier portion each operating in response to the potential of the other bit line; a line $S_2$ connected to the drain side of the n channel transistors Q1 and Q2 for discharging the potentials on the bit lines B1 and B2; an I/O line connected to the bit lines B1 and B2 for transmitting the potential difference to the sensing circuit; PES and PEP lines for applying a prescribed precharge potential to the bit lines B1 and B2; and a charging circuit for charging bit lines B1 and B2. A PES (Precharge Equalizing Signal) is applied to the PES line so as to bring the two bit lines B1 and B2 to the same potential, and the transistors Q3 and Q4 are turned on. A prescribed potential $V_P$ is applied to the bit lines B1 and B2 from the precharge equalizing power supply (PEP), whereby the bit lines B1 and B2 are brought to the floating state. A certain word line $R_{XN}$ is selected and a certain memory cell $Q_{NX}$ is selected. Let us assume that charges representing information are held in the memory cell $Q_N$. Namely, it is assumed that the cell $Q_{NX}$ is in the "H" state. Therefore, the potential of the bit line B2 changes by $\Delta H$ as is shown in the equation (1). On this occasion, the word line $DMRX_0$ connected to the dummy cell $D_{X0}$ is simultaneously selected and the dummy cell $D_{X0}$ connected to the other bit line B1 is also selected. The dummy cell $D_{X0}$ is always brought to the "L" state before reading. The reason for this is that the output voltage from the dummy cell is used as the reference voltage for reading. Consequently, the voltage of the dummy cell changes by $\Delta V_D$ as shown in the equation (3). FIG. 5 schematically shows the comparison of the voltage carried out by the sense amplifier. Referring to FIG. 5, in the case described in the foregoing, the voltage of the bit line B2 to which the memory cell in the "H" state is connected will be $V_P + \Delta V_H$. Meanwhile, the voltage of the bit line B1 to which the dummy cell is connected will be $V_P + \Delta V_D$. The voltages of the two are compared with each other, and it is determined whether the charges representing information is held or not in the memory cell. In the present example, $V_P + \Delta V_H > V_P + \Delta V_D$. Consequently, it is determined that the memory cell is in "H" state. The sense amplifier operates, whereby the potential of the point B, which is the lower potential of the nodes A and B is discharged through the transistor Q2 and S2. The potential of S2 is gradually decreased at an optimal speed so as to prevent the potential of the point A which is the higher potential from being discharged, and when the potential difference between the nodes A and B becomes sufficiently large, the potential of S2 is rapidly decreased to 0 V. Meanwhile, the gate electrode of the transistor Q1 is connected to the node B. Therefore, the node A is discharged to some extent through the transistor Q1 and the potential of the node A is decreased before the potential of the node B reaches 0 V. Thereafter, the transistor Q1 becomes non-conductive. Succeedingly, the charging circuit begins its operation. Only the bit line B2 to which the memory cell at high potential is connected is charged again to $V_{cc}$. Consequently, the memory cell is fully brought back to "H" level. The circuit is structured such that the bit line B1 on the lower potential side is not re-charged.

The foregoing is the operation of the sense amplifier when the memory cell is in the "H" state. When the memory cell in the "L" state, the voltage of the bit line B2 will be $V_P + \Delta V_L$ with $V_P + \Delta V_L < V_P + \Delta V_D$. Consequently, it is determined that the memory cell is in the "L" state. Thereafter, the sense amplifier carries out the operation reverse to the foregoing.

The conventional sense amplifier is structured and operated as described above. The presence/absence of the signal charges in the memory cell is determined based on the value $\Delta V_H$ and $\Delta V_L$. As is shown in the equations (1) to (3), the values $\Delta V_H$ and $\Delta V_L$ are determined not only by the capacitor capacitance $C_S$ of the memory cell but also the capacitor capacitance $C_B$ of the bit lines. Therefore, if the capacitor capacitance $C_B$ of the bit line is large, the sense amplifier needs much time to amplify the small voltage differences $\Delta V_H$, $\Delta V_L$ and $\Delta V_D$.

SUMMARY OF THE INVENTION

Therefore, one object of the present invention is to provide a sense amplifier capable of high speed operation.

Another object of the present invention is to provide a sense amplifier having a simple structure capable of high speed operation.

A further object of the present invention is to provide a sense amplifier in which the capacitance of the bit line has no influence on sensing.

A still further object of the present invention is to provide a sense amplifier capable of reducing time required for sensing.

The above described object of the present invention can be attained by a sense amplifier comprising: a first bit line to which at least one first memory cell and at least one first dummy cell are connected; a second bit line to which at least one second memory cell different from the first memory cell and at least one second dummy cell different from the first dummy cell are connected, a potential difference generated between the first and second bit lines by a signal from the first or second memory cell and the first and second dummy cell; an amplifier connected to the first and second bit lines for amplifying the potential difference; and first and second switching devices respectively provided between the amplifier and the first and second bit lines operating in response to the potential on the first and second bit lines.

Since the sense amplifier comprises the above described components, the amplifier is cut off from the first and second bit lines by the switching device. When the sense amplifier senses the potential difference, the potential difference defined by the bit line capacitance and the memory cell capacitance is used as the reference. After the sense amplifier begins sensing, the switching device on the side of the lower potential operates in response to the potential of the bit line, whereby the amplifier is cut off from the bit line of the lower potential as described above. Therefore, the time lag in the sensing operation derived from the bit line capacitance is not generated. Therefore, a sense amplifier can be provided which is capable of high speed operation.

According to a preferred embodiment, the amplifier comprises an n type MOS transistor connected in series to the first bit line operating in response to the second bit line, a n type MOS transistor connected in series to the second bit line operating in response to the first bit line, and the first and second switching devices comprise p type MOS transistors with the gates grounded.

Since the sense amplifier comprises the above described components, the first or second p type MOS transistor connected to the bit line of lower potential turns off as the time passes. Therefore, after a prescribed time period, the sense amplifier is completely cut off from the bit line of the lower potential. Consequently, a sense amplifier having a simple structure is provided which is capable of high speed operation.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 6A shows the main portion of the sense amplifier in accordance with the present invention, while FIG. 6B shows the portions of a conventional sense amplifier corresponding to FIG. 6A.

DESCRIPTION OF THE PREFERRED EMBODIMENTS

Figures 6A, 6B:
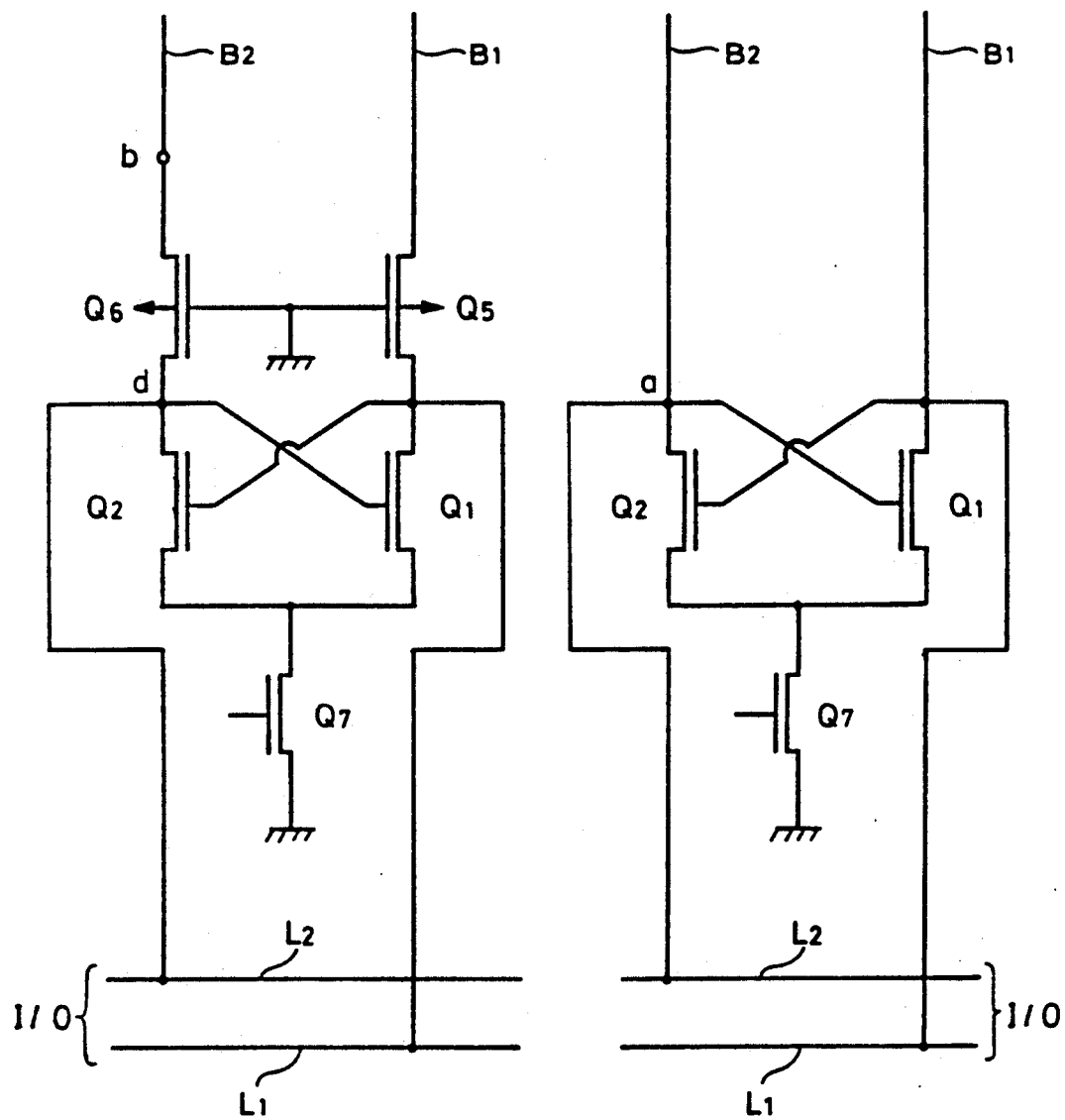

A major portion of the sense amplifier circuit in accordance with the present invention is shown in FIG. 6A. The corresponding portion of a conventional sense amplifier circuit is shown in FIG. 6B.

Referring to FIG. 6A, the sense amplifier in accordance with the present invention comprises n channel MOS transistors Q1 and Q2 connected in series to the bit lines B1 and B2 for amplifying the potential difference between the bit lines B1 and B2, each operating in response to the potential of the other bit line, and p channel MOS transistors Q5 and Q6 connected in series between the bit lines B1 and B2 and n channel MOS transistors Q1 and Q2 operating in response to the ground potential. The drain sides of the n channel MOS transistors Q1 and Q2 are connected to a n channel MOS transistor Q7 grounded for discharging the potential on the bit lines B1 and B2. Different from the conventional sense amplifier, p channel MOS transistors Q5 and Q6 are provided between the bit lines B1 and B2 and the n channel MOS transistor Q1 and Q2 which are the amplifying portion.

Figure 1:
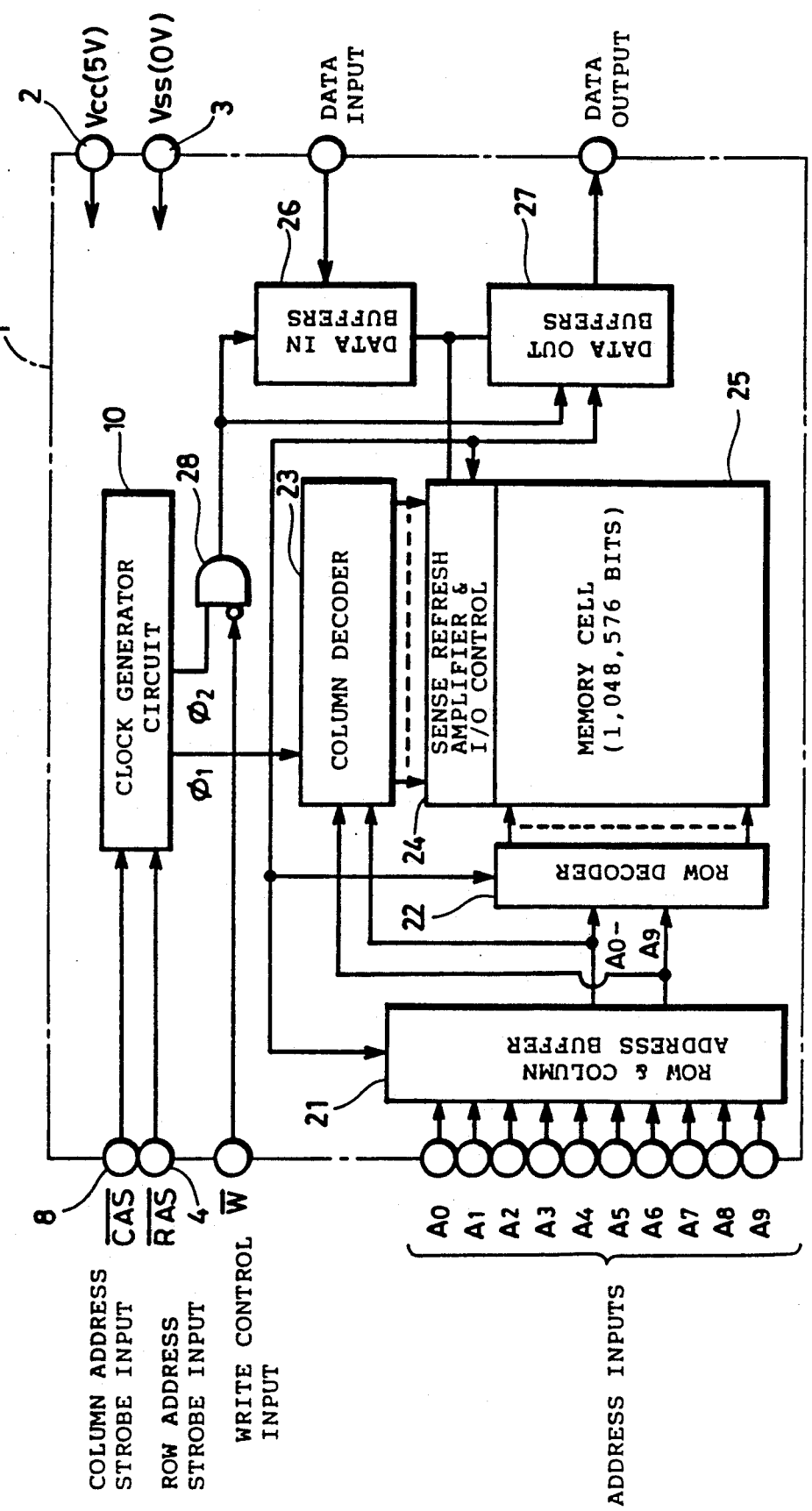
FIG. 1 is a block diagram showing an example of a simplified circuit of a conventional dynamic RAM.
Figure 2:
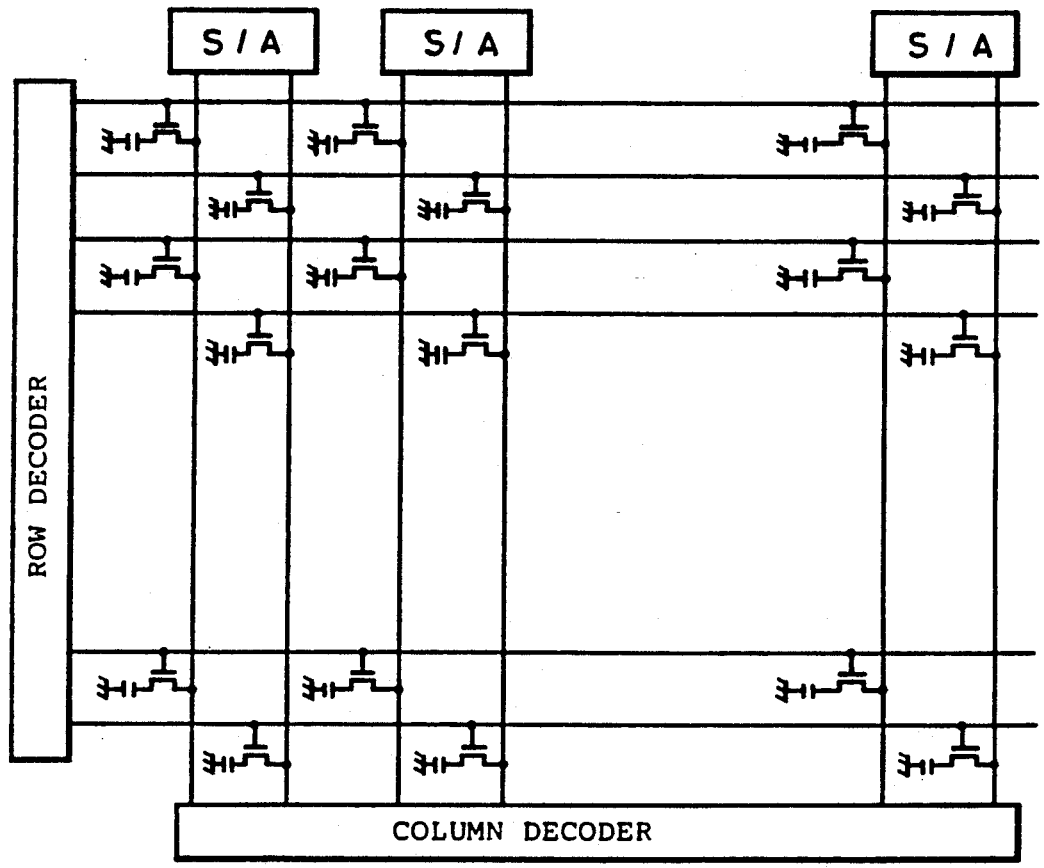
FIG. 2 is a block diagram showing a major portion of a conventional dynamic RAM.
Figure 3:
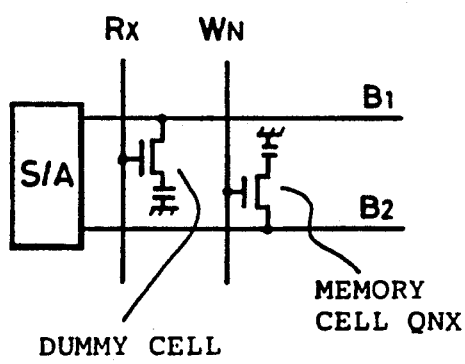
FIG. 3 is a schematic diagram for illustrating the operation of the sense amplifier.
Figure 5:
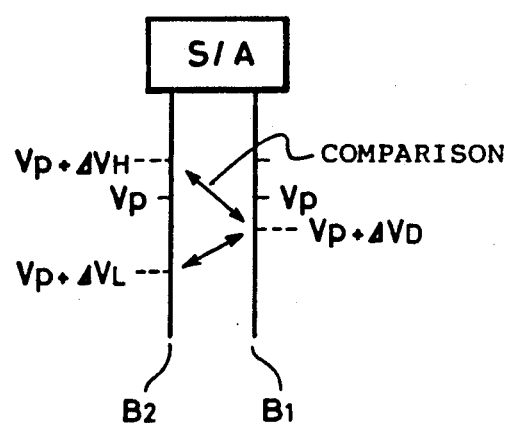
FIG. 5 schematically shows the comparison of the voltages carried by the sense amplifier.
Figure 4:
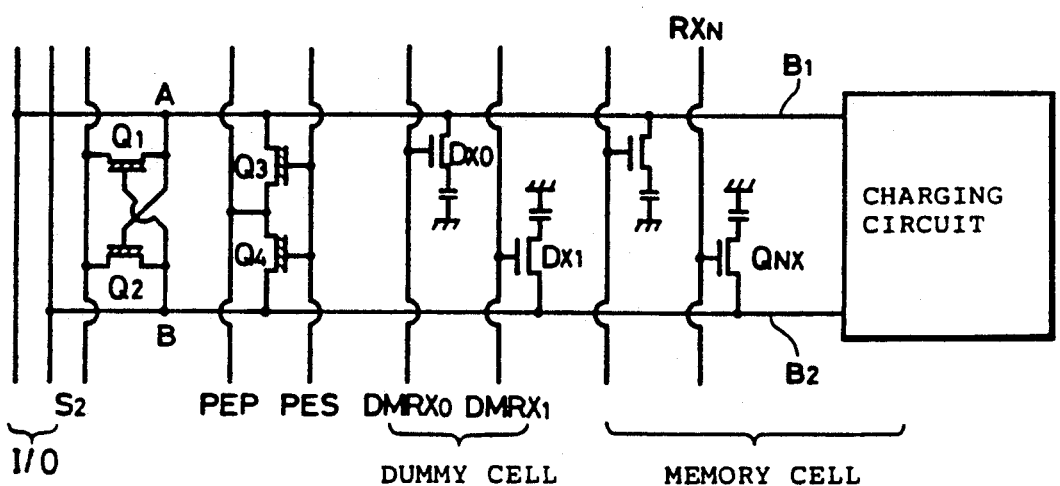
FIG. 4 is a diagram of a basic circuit of the sense amplifier.
Figure 7:
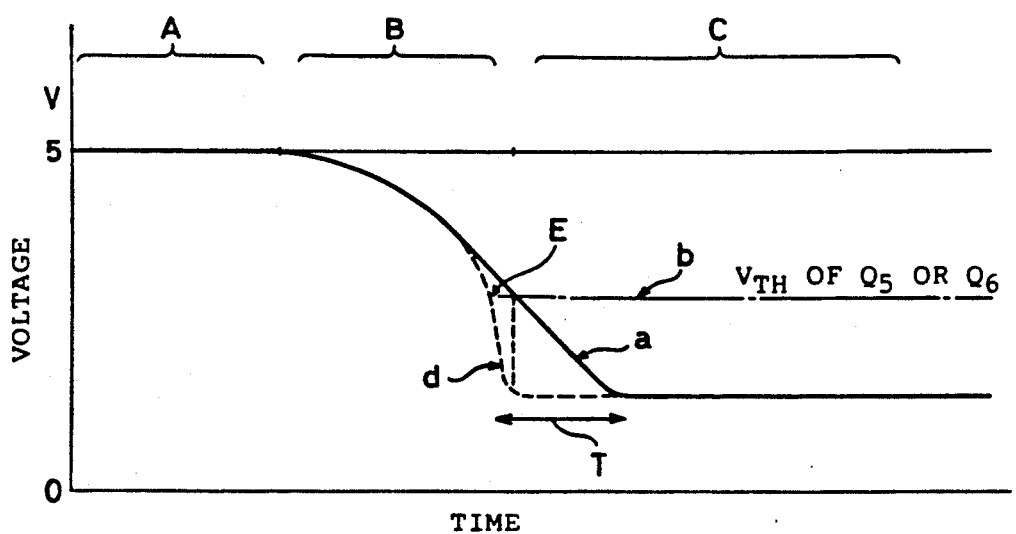
FIG. 7 is a diagram for illustrating the operation of the sense amplifier in accordance with the present invention.

FIG. 7 shows the state of operation of the sense amplifier in accordance with the present invention. The abscissa represents time while the ordinate represents potential of the bit line. The operation characteristics of the conventional sense amplifier is also shown for the purpose of comparison. Referring to FIG. 7, the operation of the sense amplifier in accordance with the present invention will be described in the following. A potential difference is generated between the bit lines B1 and B2, the transistor Q7 is turned on and the sense amplifier begins sensing. Now, let us assume that the bit line B1 is at the "H" level while the line B2 is at the "L" level. Since the gate of the transistors Q5 and Q6 are grounded, both transistors Q5 and Q6 are on at the initial state. This corresponds to the portion A in FIG. 7. Since the bit line B1 is at the high level, the transistor Q2 turns on. Consequently, the potential of the bit line B2 at the "L" level is discharged through the transistor Q7. Therefore, the potential of the bit line B2 gradually decreases. As a result, the transistor Q6 is gradually turned off. This state corresponds to the portion B in FIG. 7. When the level of the bit line B2 coincides with the threshold value of the transistor Q6, the transistor Q6 is fully turned off. Accordingly, the bit line B2 is completely cut off from the transistor Q2 (corresponds to the point E in FIG. 7). From this time on, the transistor Q6 remains off (it corresponds to the portion C in FIG. 7). This means that the bit line capacitance $C_B$ has no influence when the sense amplifier carries out the sensing operation. Consequently, the potentials at the points b and d shown in FIG. 6A change in the manner shown by the arrows b and d in FIG. 7. The change of the potential at the point a of FIG. 6B in the conventional sense amplifier is also shown in FIG. 7. In the prior art, the capacitance $C_B$ of the bit line affects the sensing operation of the sense amplifier, and therefore there is a voltage change such as shown by a in FIG. 7. On the contrary, according to the present invention, the voltage at the point d changes as shown by d in FIG. 7. Consequently, the time required for sensing is reduced by the period T shown in FIG. 7.

Description was given of a case in which the bit line B1 is at the "H" level in the foregoing. If the bit line B2 is at the "H" level, the transistor Q5 cuts off the bit line B1 from the transistor Q1. Other points are the same as the above description.

In the present invention, a transistor with its gate grounded is provided between the sense amplifier and two bit lines for comparison. When the sensing operation is started, the sense amplifier is cut off from the bit lines. Therefore, the influence of the bit line capacitance on the sensing operation can be reduced. Consequently, a sense amplifier can be provided which is capable of sensing in a shorter time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A sense amplifier for amplifying a signal stored in the memory cell for reading, comprising:
   a first bit line to which at least one first memory cell and at least one first dummy cell are connected;

a second bit line to which at least one second memory cell different from said first memory cell and at least one second dummy cell different from said first dummy cell are connected;

a potential difference being generated between said first and second bit lines by a signal from said first or second memory cell and said first or second dummy cell;

amplifying means connected to said first and second bit lines for amplifying said potential difference; and first and second switching means in said first and second bit lines and respectively located between said amplifying means and one of said first and second memory cells and between said amplifying means and one of said first and second dummy cells, said first and second switching means being operated in response to the potentials of said first and second bit lines.

2. A sense amplifier according to claim 1, wherein said sense amplifier is connected to signal transmitting means for transmitting signals amplified by said amplifying means, and said amplifying means comprises third switching means connected between said first bit line and said signal transmitting means operating in response to the potential of said second bit line, and fourth switching means connected between said second bit line and said signal transmitting means operating in response to the potential of said first bit line.

3. A sense amplifier according to claim 2, wherein said third and fourth switching means comprise a MOS transistor of a first conductivity type.

4. A sense amplifier according to claim 3, wherein said first and second switching means comprise a MOS transistor of a second conductivity type.

5. A sense amplifier according to claim 4, wherein said MOS transistor of the first conductivity type comprises a n type MOS transistor, and said MOS transistor of the second conductivity type comprises a p type MOS transistor with a gate electrode grounded.

6. A semiconductor dynamic random access memory comprising:

a first bit line to which at least one first memory cell and at least one first dummy cell are connected;

a second bit line to which at last one second memory cell different from said first memory cell and at least one second dummy cell different from said first dummy cell are connected;

a potential difference being generated between said first and second bit lines by a signal from said first or second memory cell and from said first or second dummy cell;

a sense amplifier connected to said first and second bit lines for amplifying said potential difference; and first and second switching means in said first and second bit lines and respectively located between said amplifying means and one of said first and second memory cells and between said amplifying means and one of said first and second dummy cells, said first and second switching means being operated in response to the potentials of said first and second bit lines.

* * * * *